United States Patent [19]

Mizuno et al.

[11] Patent Number: 5,851,906
[45] Date of Patent: Dec. 22, 1998

[54] IMPURITY DOPING METHOD

[75] Inventors: Bunji Mizuno, Ikoma; Hiroaki Nakaoka, Katano; Michihiko Takase, Neyagawa; Ichiro Nakayama, Kadoma, all of Japan

[73] Assignee: Matsushita Electric Industrial Co., Ltd., Japan

[21] Appl. No.: 698,154

[22] Filed: Aug. 7, 1996

[30] Foreign Application Priority Data

Aug. 10, 1995 [JP] Japan ................................ 7-204256

[51] Int. Cl.⁶ ........................................ H01L 21/263
[52] U.S. Cl. ................................ 438/513; 438/567
[58] Field of Search ............................ 438/513, 558, 438/560, 565, 566, 567

[56] References Cited

U.S. PATENT DOCUMENTS

| 4,465,529 | 8/1984 | Arima et al. ............................ 438/565 |
| 4,912,065 | 3/1990 | Mizuno et al. ........................ 438/513 |
| 4,937,205 | 6/1990 | Nakayama et al. ..................... 438/513 |

OTHER PUBLICATIONS

1993 Symposium on VLSI Technology, May 17–19, 1993.

*Primary Examiner*—Chandra Chaudhari
*Attorney, Agent, or Firm*—Parkhurst & Wendel

[57] ABSTRACT

In order to dope impurities selectively at low temperature where the resist can be used, the invention presents an impurity doping method capable of performing not only cleaning process but also doping process at low temperature where the resist can be used. First, the active sample surface of a solid sample is exposed by irradiation with plasma, and without active irradiation with plasma, the gas or vapor containing object impurities is contacted with the active sample surface of the solid sample to dope the impurities. As a result, the impurity doping process at the time of formation of C-MOS structure or the like can be executed at low temperature so as not to spoil the function of the resist.

3 Claims, 5 Drawing Sheets

IMPURITY DOPING METHOD

FIELD OF THE INVENTION

The present invention relates to a manufacturing method of semiconductor, and more particularly to a doping method of impurities by adhering or depositing atoms or molecules onto the surface of a solid at low temperature (especially in a region from room temperature to ultralow temperature) to implant the atoms or molecules near the solid surface.

BACKGROUND OF THE INVENTION

Hitherto, concerning doping of impurities on the surface of a silicone substrate as solid surface, for example, an art printed in "Digest of technical papers 1993 symposium on VLSI technology, pp. 97–98" is known.

More specifically, first, a silicon wafer put in a vacuum cell is kept at high temperature (for example, about 800° C.), and gas containing hydrogen is introduced into the vacuum cell, and the surface of the silicon wafer is cleaned.

Next, in the vacuum cell containing the cleaned silicon wafer, gas containing specified elements (for example, diborane $B_2H_6$) is introduced, and by merely exposing to the gas, the desired atoms or molecules of boron are deposited or adsorbed on the surface of the silicone wafer to be doped. At this time, in order to dope the impurities uniformly into the surface of the silicon wafer by promoting decomposition of gas for doping impurities introduced in the vacuum cell mainly, and also diffusion of the impurities in the vacuum cell, the temperature for introducing the doping gas is about 900° C.

Then, by connecting electric wiring to the silicon wafer forming the doping layer and forming a thin oxide film in specified oxidizing atmosphere, a gate electrode is formed by CVD device or the like, and thereby a MOS transistor is formed.

DISCLOSURE OF THE INVENTION

Thus, in the conventional impurity doping method, since the surface of the silicon substrate as the solid surface is exposed to high temperature of 800° C. to 900° C., it is impossible to dope selectively by using resist (so-called novolak type resin, etc.). This is because the resisting heat limit of the ordinary resist is about 250° C., and the resist melts down at higher temperature to be fluidized, and the pattern itself cannot be formed.

In other words, if at least either cleaning process or doping process is done at a temperature above the heat resisting temperature of the resist, selective doping cannot be done. In the cleaning process, meanwhile, if merely the temperature is lowered because the resist cannot be used at high temperature, the gas (specifically, hydrogen gas) does not react with the surface of the silicon substrate, and hence it cannot be cleaned.

More particularly, when introducing the gas containing the impurities to be doped into the vacuum cell, if attempted to dope by feeding at low temperature without heating up to 900° C., the surface of the substrate to be doped with impurities must be not only cleaned but also activated. When the cleaning process is done at 800° C., the resist cannot be used in the cleaning process because of the resisting heat limit. Hence, the resist pattern is formed after cleaning, and when the resist pattern is formed, the surface of the silicon substrate once activated in the cleaning process is no longer active.

It is hence a primary object of the invention to present a doping method of impurities capable of performing not only cleaning process but also doping process at low temperature allowing to use resist, because the impurities are doped selectively at low temperature allowing to use the resist.

The resist is used quite commonly in the super-LSI manufacturing process, and if it cannot be used, it gives rise to necessity of forming a doping preventive film. This doping preventive film (for example, a silicon nitride film) itself is also formed selectively by using a resist pattern. The process for such selective forming of the doping preventive film alone is complicated, and the increase of cost cannot be avoided. Moreover, the impurity distribution formed by doping diffuses impurities in the depth direction, too, when the temperature becomes higher. Therefore, when the doping process is done at high temperature, it is impossible to distribute the impurities accurately.

It is also an object of the invention to present a doping method of impurities capable of performing the impurity doping process at the time of forming C-MOS structure or the like, at a low temperature not spoiling the function of the resist, so that forming of doping preventive film is not necessary.

The invention relates to an impurity doping method for doping impurities near the surface of a solid sample, comprising the steps of feeding inert gas or inert gas containing reducing gas into a vacuum cell containing the solid sample, exciting the gas, and generating plasma on the surface of the solid sample, exposing an active sample surface on the surface of the solid sample by irradiating with plasma, and doping the impurities by contacting the gas or vapor containing the impurities, without active irradiation of plasma, with the active sample surface of the solid sample.

In this constitution, the impurity doping process at the time of forming the CMOS structure or the like can be executed at low temperature so as not to spoil the function of the resist, from the surface cleaning to the impurity doping.

Moreover, thermal diffusion of impurities can be completely avoided, the constitution of the impurities can be held perfectly as designed, so that an impurity diffusion layer of high precision can be formed.

The invention also relates to an impurity doping method for doping impurities near the surface of a solid sample, comprising the steps of covering the sample surface of the solid sample leaving the impurity doping area, feeding inert gas or inert gas containing reducing gas into a vacuum cell containing the solid sample, exciting the gas, and generating plasma on the surface of the solid sample, exposing an active sample surface on the surface of the solid sample by irradiating with plasma, and doping the impurities on the exposed active sample surface of the solid sample not covered with the resist by contacting the gas or vapor containing the impurities, without active irradiation of plasma, with the active sample surface of the solid sample.

The invention further relates to an impurity doping method for forming a region of N type MOS and/or other devices and a region of P type MOS and/or other devices by doping impurities near the surface of a solid sample, comprising the steps of covering the sample surface of the solid sample leaving the first impurity doping area, feeding inert gas or inert gas containing reducing gas into a vacuum cell containing the solid sample, exciting the gas, generating plasma on the surface of the solid sample, exposing an active sample surface on the surface of the solid sample by irradiating with plasma, and doping the first impurities on the exposed active sample surface of the solid sample not covered with the resist by contacting the gas or vapor containing the first impurities, without active irradiation of plasma, with the active sample surface of the solid sample, covering the sample surface of the solid sample leaving the second impurity doping area, and feeding inert gas or inert gas containing reducing gas into a vacuum cell containing the solid sample, exciting the gas, generating plasma on the surface of the solid sample, exposing an active sample surface on the surface of the solid sample by irradiating with plasma, and doping the second impurities on the exposed active sample surface of the solid sample not covered with the resist by contacting the gas or vapor containing the second impurities, without active irradiation of plasma, with the active sample surface of the solid sample.

DESCRIPTION OF EMBODIMENTS

Figure 1:
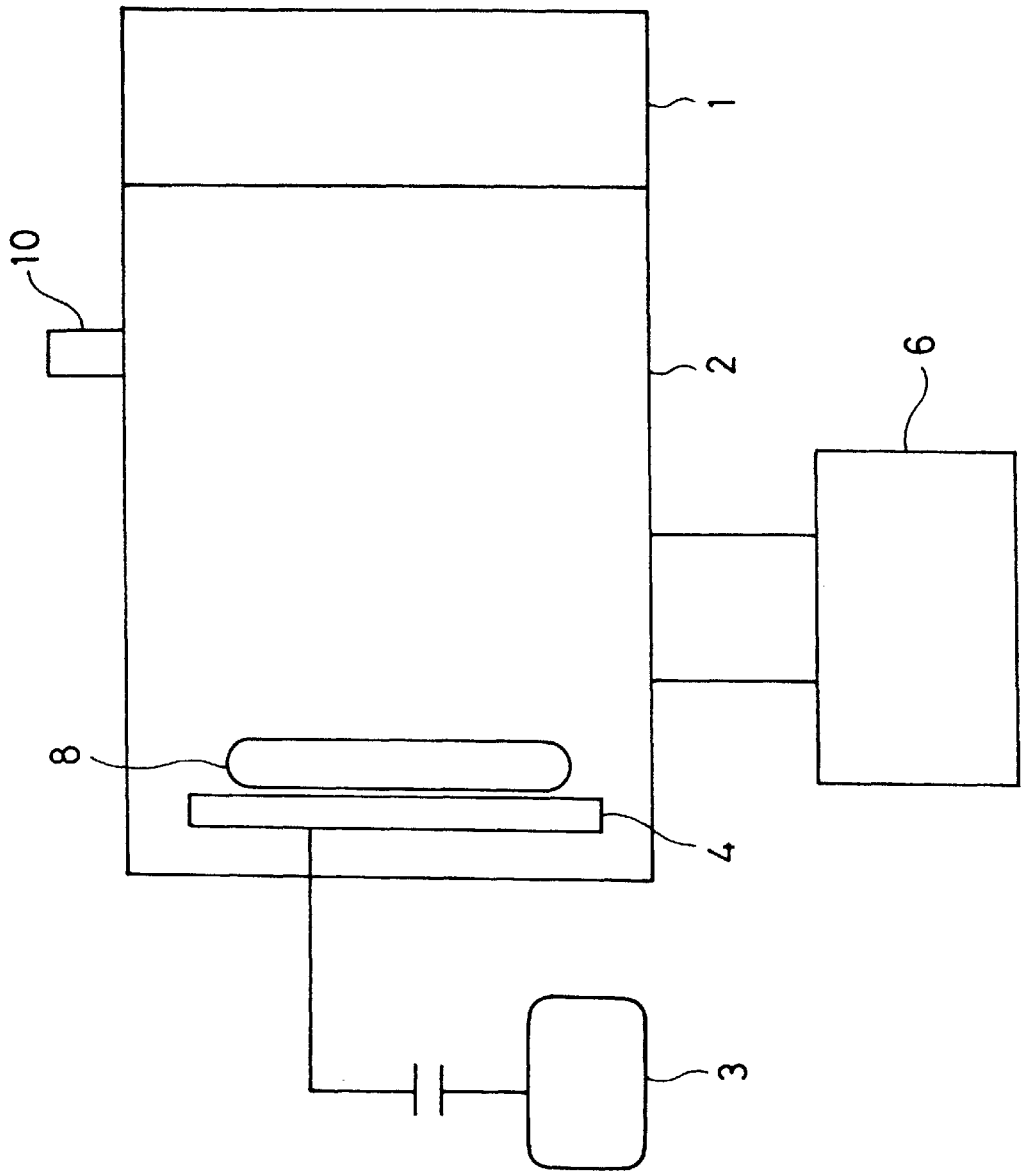
FIG. 1 is a block diagram of a coping apparatus used in impurity doping of a first embodiment of the invention 1.
Figure 2:
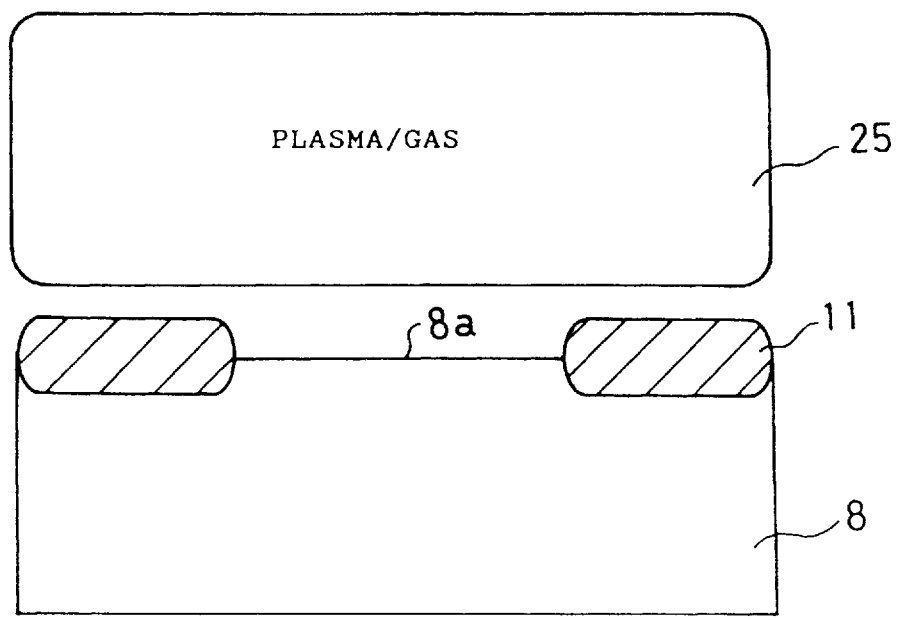
FIGS. 2(a) and 2(b) are schematic representations of impurity doping of the same embodiment of FIG. 1.
Figure 2:
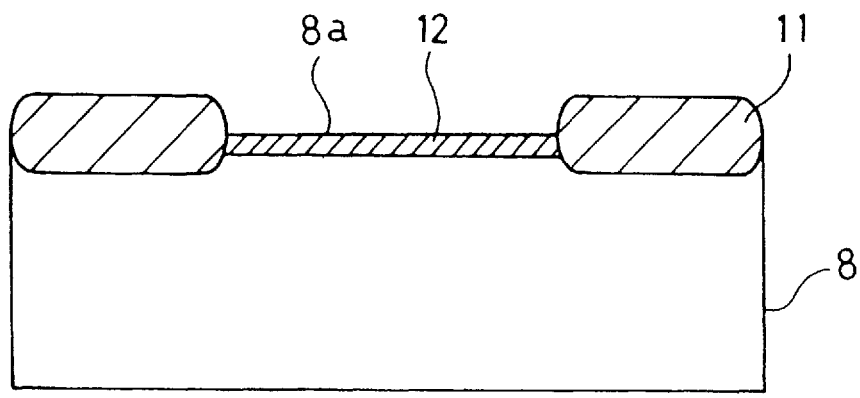

Embodiments of impurity doping of the invention are described below by referring to the drawings.

EMBODIMENT 1

FIG. 1 to FIGS. 3(a) and (b) show embodiment 1.

In FIG. 1, a silicon substrate 8 to be doped with impurities is set in a support stand 4 in a vacuum cell 2. The support stand 4 is equipped with cooling means, and the silicon substrate 8 is kept at low temperature.

The vacuum cell 2 comprises a microwave generation source 1 and a high frequency power source 3 for generating plasma. As the gas feed system to be fed into the vacuum cell 2, a gas feed 10 and a pump 6 for exhausting the gas in the vacuum cell 2 are installed.

Figure 3A:
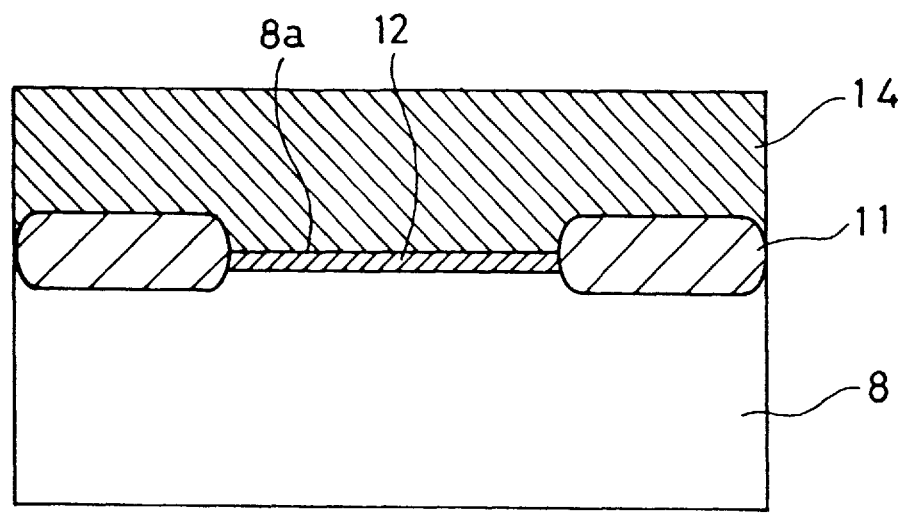
FIGS. 3(a) and 3(b) are further schematic representations of impurity doping of the embodiment FIG. 1.

FIG. 2(a) and (b) and FIGS. 3(a) and (b) show a diode fabricating process employing the apparatus shown in FIG. 1.

First, as shown in FIG. 2(a), on a substrate surface 8a of an element region of the silicon substrate 8 having the element region separated by an insulation separating film 11, prior to forming a desired impurity layer, inert gas (for example, helium, neon, argon) or inert gas containing reducing gas (for example, hydrogen) is introduced from the gas feed 10, and plasma 25 is generated on the silicon substrate 8.

The plasma 25 is generated by using 2.45 GHz microwave generated from the microwave generation source 1 and 13.56 MHz high frequency generated from the high frequency power source 3. At this time of introducing the gas, the degree of vacuum was about $3 \times 10^{-4}$ Torr, the output power of the microwave generation source 1 was about 500 W, and the output power of the high frequency power source 3 was about 300 W.

By emission of thus formed plasma, the spontaneous oxide film on the substrate surface 8a of the silicon substrate 8 is removed, and a clean and active silicon surface is exposed.

When the clean and active silicon surface is exposed, in next process, the plasma emission is stopped so that the plasma emission may not act on the substrate surface 8a.

Consequently, in the environment of stopping of plasma emission on the clean and active substrate surface 8a, the gas containing the desired doping impurities is introduced into the vacuum cell 2 from the gas feed 10, and the gas containing impurities is brought in contact with the substrate surface 8a.

By this gas introduction, impurities directly deposit on the clean and active substrate surface 8a, and an impurity layer 12 (having an opposite conductive type of silicon substrate 8) is formed as shown in FIG. 2(b). More specifically, by stopping plasma emission, a shallow impurity layer can be formed in the following mechanism.

First, without using plasma gas, the energy of the impurity particles does not become too large, and deep doping is avoided. Second, since plasma diffusion of impurity particles is absent, deep doping is avoided, too.

The temperature for exposing the clean and active substrate surface 8a and for introducing impurities was both as low as 40° C.

In succession, as shown in FIG. 3(a), on the silicon substrate 8 doped with impurities, an insulator layer 14 of, for example, CVD silicon oxide film is deposited in 500 nm. Later, the impurity distribution may be controlled by proper heat treatment, and in this embodiment, heat treatment was conducted for 10 seconds at 1000° C. Since high temperature heat treatment is not given before this heat treatment, the impurity layer could be formed thinly as compared with the prior art.

Figure 3B:
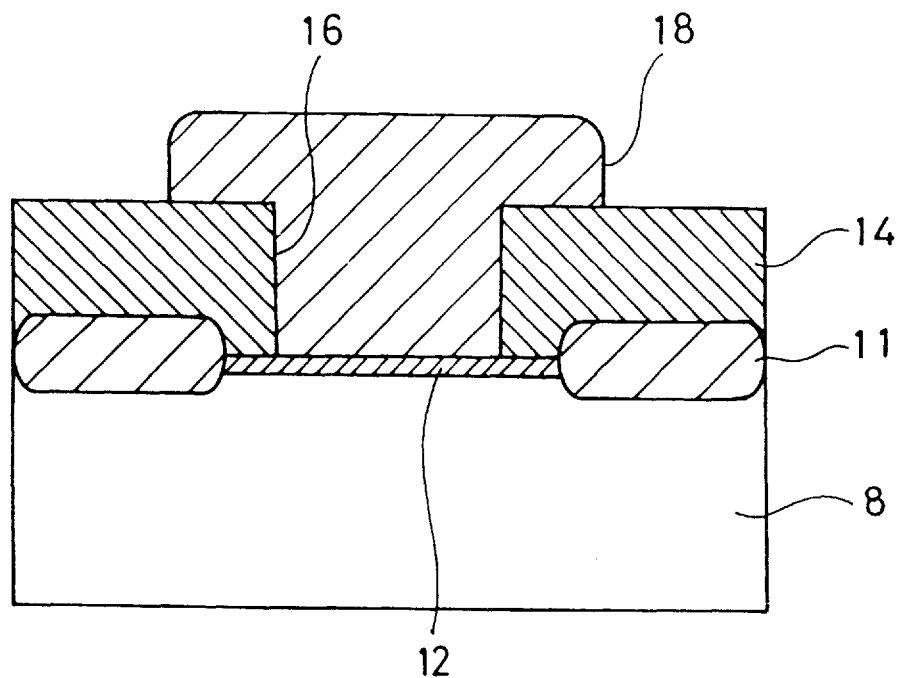

Finally, as shown in FIG. 3(b), an opening 16 is formed in the insulator layer 14 by photolithographic technique and etching technique, and a single layer film or multiple layer film of metal is formed for forming metal wiring. By patterning this metal film by photolithographic technique and etching technique, a metal wiring 18 is formed, and a diode is formed completely.

In this way, it is in the vacuum that the substrate surface 8a is exposed to the plasma containing inert gas and hydrogen, and hence the impurities to be applied on the substrate surface are more likely to adsorb, and hence the silicon substrate can be doped with impurities even at low temperature close to ordinary temperature.

More specifically, dangling bond is exposed on the substrate surface 8a, and it becomes very active chemically, and when the gas containing impurities contacts with the substrate surface 8a, decomposition of gas is promoted.

Incidentally, in the reaction at ordinary temperature in the non-plasma environment, movement or diffusion of impurities did not occur at all, and an extremely thin junction could be formed. It means that a junction of about 40 nm in depth required at the time of forming a thin device of less than 0.1 $\mu$m, in particular, can be formed.

EMBODIMENT 2

Figure 4A:
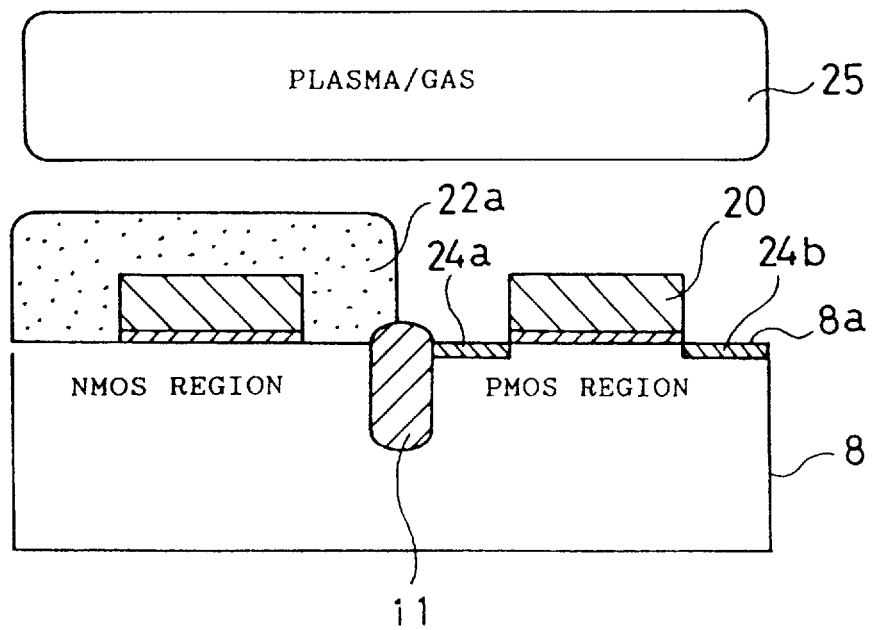
FIGS. 4(a) and 4(b) are schematic representations of impurity doping of the embodiment of FIGS. 2(a) and 2(b)
Figure 5A:
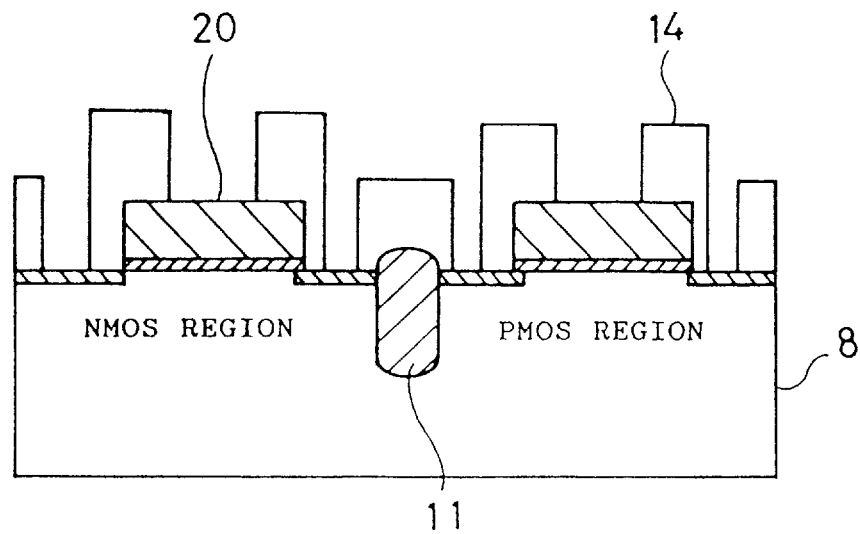
FIGS. 5(a) and 5(b) are schematic representations of impurity doping of the embodiment of FIGS. 2(a) and 2(b).

FIGS. 4(a) (b) and FIGS. 5(a) and (b) refer to embodiment 2.

This embodiment shows a manufacturing process of CMOS semiconductor device by an impurity doping method making use of patterning by the resist (for example, photo resist) of novolak resin or the like at the time of impurity doping.

The basic manufacturing process is same as in embodiment 1, and a resist pattern is formed herein by opening a region desired to diffuse impurities. Thus, by introducing the impurities by covering other area than impurity diffusion with the resist, selective doping can be done very easily.

FIG. 4 (a) shows an intermediate step of manufacturing process of MOS semiconductor device, in which an insulation separating film 11 and a gate electrode 20 are formed, and in this stage, the adjacent two MOS films can be manufactured into P type MOS and N type MOS. First, the region for making N type MOS is covered with resist 22a, and the silicon substrate 8 in this state is set in the vacuum cell 2 as shown in FIG. 1, and the following process is conducted.

Inert gas or inert gas containing reducing gas is introduced from the gas feed 10, and plasma is formed. At this time, the plasma is generated by using microwave of 2.45 GHz and high frequency of 13.56 MHz, and at this time of introducing the gas, the degree of vacuum was about $3 \times 10^{-4}$ Torr, the output power of the microwave generation source 1 was about 500 W, and the output power of the high frequency power source 3 was about 300 W.

By this plasma emission, the spontaneous oxide film in the P type MOS region of the silicon substrate 8 is removed, and a clean and active surface 8a is exposed.

Consequently, gas containing, for example, boron is introduced from the gas feed 10 as impurity. By this gas introduction, impurities directly deposit on the clean and active substrate surface 8a, thereby forming an impurity layer 24a which becomes later a gate electrode of P type MOS, and an impurity layer 24b to become a drain electrode.

Figure 4B:
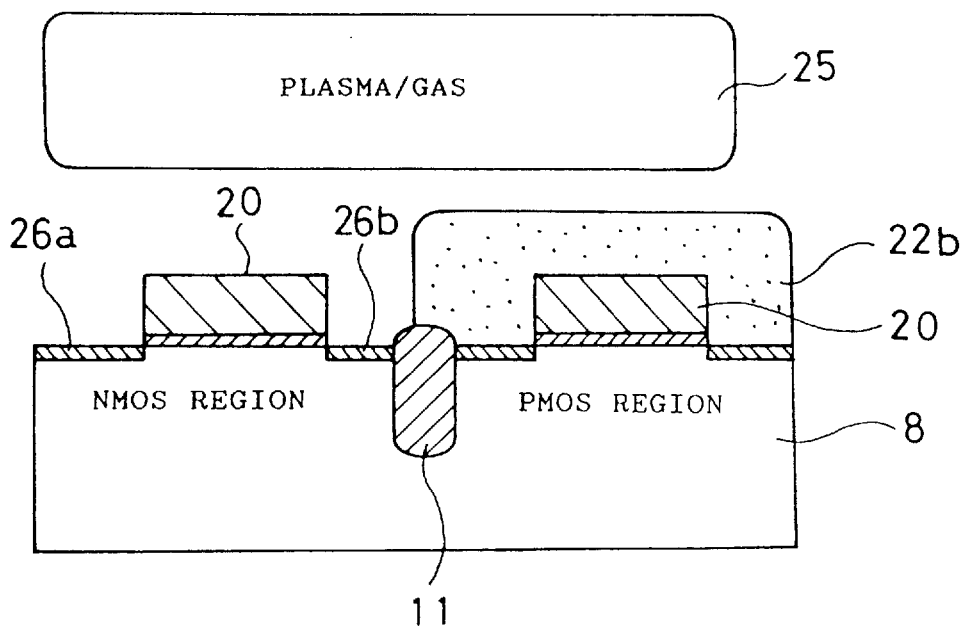

After removing the resist 22a, as shown in FIG. 4(b), the P type MOS region loaded with boron in FIG. 4(a) is covered with resist 22b. The impurity doping procedure is same, and in this case, for example, doping with arsenic by gas containing arsenic, an impurity layer 26a which becomes later a gate electrode of N type MOS and an impurity layer 26b to become a drain electrode are formed.

After removing the resist 22b, the following process is conducted.

On the silicon substrate 8 doped with impurities of boron and arsenic, an insulator of, for example, CVC oxide film, is deposited in, say, 500 nm. Afterwards, the impurity distribution may be controlled by proper heat treatment, and in this embodiment, heat treatment was conducted for 10 seconds at 1000° C. An opening 16 is formed in this insulator as shown in FIG. 5(a) by photolithographic technique and etching technique.

Figure 5B:
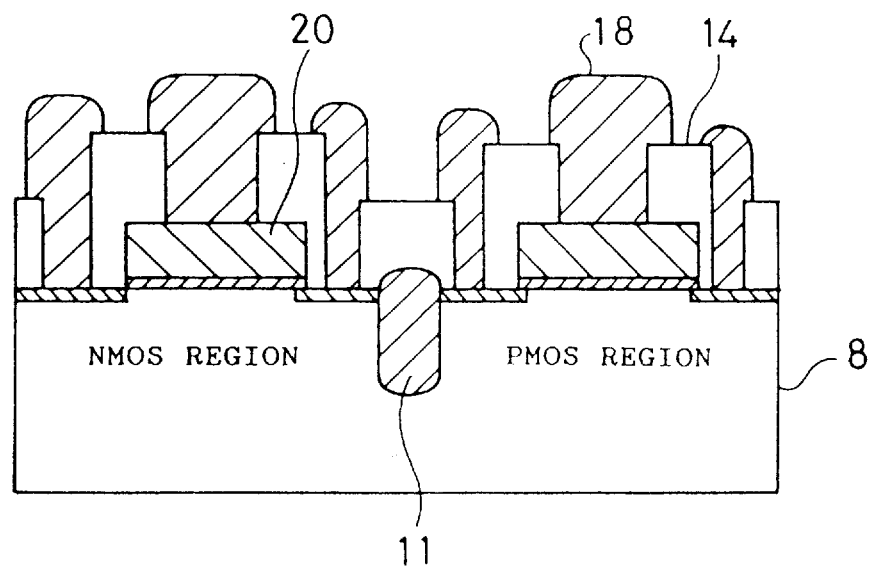

Consequently, to form metal wiring, a single layer film or multiple layer film of metal is formed, and this metal film is patterned by photolithographic technique and etching technique, and a metal wiring 18 is formed as shown in FIG. 5 (b).

To keep a favorable electric contact between the impurity diffusion layer and metal layer in the insulation film opening, a proper impurity distribution may be formed in the impurity layer of the contact area by so-called ion implantation technique. At this time, in the P type MOS region, for example, boron may be implanted with energy of 15 keV by dose of $5 \times 10^{15}/cm^2$, and in the N type MOS region, for example, arsenic may be implanted with energy of 30 keV by dose of $3 \times 10^{15}/cm^2$. Of course, these numerical values vary significantly depending on the design of the semiconductor device to be designed, and adequate setting is required although detail is omitted herein.

In the foregoing embodiments, as plasma generating means, electron cyclotron resonance is employed, but the invention is not limited to this alone, and inductive coupled plasma, helicon, multi-spiral method, magnetron, two-frequency, triode, or LEP (Lissajous electron plasma), and others may be also employed. In addition, MOS may be other devices such as bipolar devices.

In these embodiments, the object impurities to contact with the clean and active substrate surface 8a were introduced into the vacuum cell 2 in gas form, but doping may be similarly achieved by installing an evaporation source of object impurities in the vacuum cell 2, and bringing the vapor evaporated from this evaporation source into contact with the clean and active substrate surface 8a.

What is claimed is:

1. An impurity doping method for doping impurities near the surface of a solid sample, comprising the steps of:
   feeding inert gas or inert gas containing reducing gas into a vacuum cell containing the solid sample, exciting the gas, and generating plasma near the surface of the solid sample,
   exposing an active sample surface on the surface of the solid sample by irradiating with plasma,
   stopping the plasma irradiation, and then doping the impurities by contacting gas or vapor containing the impurities, without active irradiation of plasma, with the active sample surface of the solid sample.

2. An impurity doping method for doping impurities near the surface of a solid sample, comprising the steps of:
   covering the sample surface of the solid sample with a resist leaving the impurity doping area uncovered,
   feeding inert gas or inert gas containing reducing gas into a vacuum cell containing the solid sample, exciting the gas, and generating plasma on the surface of the solid sample,
   exposing an active sample surface on the surface of the solid sample by irradiating with plasma,
   stopping the plasma irradiating, and then doping the impurities on the exposed active sample surface of the solid sample not covered with the resist by contacting gas or vapor containing the impurities, without active irradiation of plasma, with the active sample surface of the solid sample.

3. An impurity doping method for forming a region of N type MOS and/or other devices and a region of P type MOS and/or other devices by doping impurities near the surface of a solid sample, comprising the steps of:
   covering the sample surface of the solid sample with a resist leaving the impurity doping area uncovered,
   feeding inert gas or inert gas containing reducing gas into a vacuum cell containing the solid sample, exciting the gas, generating plasma on the surface of the solid sample, exposing an active sample surface on the surface of the solid sample by irradiating with plasma, stopping the plasma irradiation, and then doping the first impurities on the exposed active sample surface of the solid sample not covered with the resist by contacting gas or vapor containing the first impurities, without active irradiation of plasma, with the active sample surface of the solid sample, covering the sample surface of the solid sample with a resist leaving the second impurity doping area uncovered, and feeding inert gas or inert gas containing reducing gas into a vacuum cell containing the solid sample, exciting the gas, generating plasma on the surface of the solid sample, exposing an active sample surface on the surface of the solid sample by irradiating with plasma, stopping the plasma irradiation, and then doping the second impurities on the exposed active sample surface of the solid sample not covered with the resist by contacting gas or vapor containing the second impurities, without active irradiation of plasma, with the active sample surface of the solid sample.

* * * * *